(12) United States Patent
MacPherson et al.

(10) Patent No.: US 8,691,667 B1
(45) Date of Patent: Apr. 8, 2014

(54) METHOD AND APPARATUS FOR DEPOSITING A PATTERN ON A SUBSTRATE

(75) Inventors: Charles Douglas MacPherson, Santa Barbara, CA (US); Dennis Damon Walker, Santa Barbara, CA (US); Matthew Stainer, Goleta, CA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 1404 days.

(21) Appl. No.: 11/321,780

(22) Filed: Dec. 29, 2005

Related U.S. Application Data

(60) Provisional application No. 60/640,501, filed on Dec. 30, 2004.

(51) Int. Cl.
*H01L 21/326* (2006.01)

(52) U.S. Cl.
USPC ............... 438/466; 257/40; 257/89; 438/483; 438/500; 438/677; 438/758

(58) Field of Classification Search
USPC ...................... 438/500, 677, 758; 257/40, 89; 427/466, 483
See application file for complete search history.

(56) References Cited

U.S. PATENT DOCUMENTS

| | | | |
|---|---|---|---|
| 4,356,429 A | 10/1982 | Tang | |
| 4,539,507 A | 9/1985 | VanSlyke et al. | |
| 5,247,190 A | 9/1993 | Friend et al. | |
| 5,317,169 A | 5/1994 | Nakano et al. | |
| 5,408,109 A | 4/1995 | Heeger et al. | |
| 6,459,199 B1 | 10/2002 | Kido et al. | |
| 6,696,105 B2 * | 2/2004 | Hiroki et al. | 427/466 |
| 7,115,507 B2 * | 10/2006 | Kawase | 438/677 |
| 7,256,427 B2 * | 8/2007 | Daniels | 257/89 |
| 2001/0019782 A1 | 9/2001 | Igarashi et al. | |
| 2002/0121638 A1 | 9/2002 | Grushin et al. | |
| 2003/0029831 A1 * | 2/2003 | Kawase | 216/27 |
| 2004/0097005 A1 * | 5/2004 | Daniels | 438/99 |
| 2005/0176242 A1 * | 8/2005 | Kawase | 438/637 |
| 2007/0134930 A1 * | 6/2007 | Hastwell et al. | 438/758 |

FOREIGN PATENT DOCUMENTS

| | | |
|---|---|---|
| EP | 1 191 612 A2 | 3/2002 |
| EP | 1 191 614 A2 | 3/2002 |
| WO | WO 02/02714 A2 | 1/2002 |
| WO | WO 02/15645 A1 | 2/2002 |
| WO | WO 02/31896 A2 | 4/2002 |

OTHER PUBLICATIONS

CRC Handbook of Chemistry and Physics, 81$^{st}$ Edition, 2000 (Book not Included).

* cited by examiner

*Primary Examiner* — Alexander Sofocleous
*Assistant Examiner* — Joannie A Garcia

(57) ABSTRACT

This invention relates to a process for forming a continuous pattern on a substrate with a liquid media. Upon the deposition of the liquid media on the substrate, a portion the continuous pattern is evaporated upon contact with the substrate.

18 Claims, 3 Drawing Sheets

METHOD AND APPARATUS FOR DEPOSITING A PATTERN ON A SUBSTRATE

FIELD OF THE INVENTION

The invention relates generally to patterning substrates, organic materials, and organic electronic devices, and more specifically, to organic materials and there application to substrates to form patterns.

BACKGROUND INFORMATION

Presently, flat panel displays such as Liquid Crystal Displays (LCDs), Organic Light Emitting Displays (OLEDs), and Plasma Light Emitting Displays (PLEDs) are being examined and may play a significant role in the future of display technology. In several of these display technologies, patterning of substrates with low viscosity solutions have started attracting attention and have presented several technology hurdles.

In one conventional technology, a subtractive technology is use to produce a pattern. In this technology a layer is deposited onto a substrate. The layer is patterned by one of several methods such as photoresist patterning where portions of the layer are exposed and other portions are covered. The substrate with the layer that is patterned with photoresist is then subjected to an etching technique which removes the exposed portions of the layer. While this technology works well in certain situations, it has a number of problems. For example, there are many steps in producing a defined pattern the layer which is associated with a high cost. Also, certain materials may not be compatible with this technology which also may add to the cost of building a product.

In another technology, ink-jet technology is used to pattern the substrate. Ink-jet technology uses a liquid material that is formed into droplets that are forced out of a nozzle. However, ink-jet technology also has several problems when forming patterns on substrates. First, if a thermal ink jet technology is used, the temperatures that are used may damage the material that is being deposited to form a pattern. Additionally, another problem is that ink jet technology forms droplets in the shape of tear drops and are not intended to from continuous patterns. For example, when the droplet is ejected from the nozzle and hits the substrate the droplet splatters, thus having small amounts of the droplet contaminating unintended parts of the substrate. Further, droplet placement on a substrate is susceptible to air currents.

In another technology, continuous-stream technology is used to form a pattern on a substrate. Continuous-stream technology uses a liquid that is forced out a nozzle to form a continuous stream that is applied to a substrate. However, continuous-stream technology also has several problems. For instance, when the continuous-stream is applied to the substrate to form a pattern, critical dimensions of the pattern are extremely difficult to control. This is typically a result of the liquid spreading out across the substrate in an uncontrolled manner. Without control of dimensions, smaller patterns and feature sizes are not possible which further retards the capability of making smaller devices. Additionally, with the spreading of the liquid across the substrate, other problems can occur such as media mixing, diffusion of the pattern, and the like. All of these problems significantly increase the cost of manufacture, as well as degrading the quality of the device being manufactured.

It can readily be see that conventional subtraction, ink-jet, and continuous-stream technologies have several disadvantages and problems. Therefore, a precision continuous-flow technique for making patterns on substrates that would control critical dimensions and curtail pattern diffusion would be highly desirable.

SUMMARY OF THE INVENTION

This invention relates to a process for forming a continuous pattern on a substrate with a liquid media. Upon the deposition of the liquid media on the substrate, a portion the continuous pattern is evaporated upon contact with the substrate.

Another aspect of the invention, the evaporation of the liquid media controls the dimensions of the continuous pattern on the substrate.

Another aspect of the invention, the substrate is heated so that the rate of evaporation of a portion of the liquid media increases.

Another aspect of the invention, an active layer is applied to the substrate with a portion of the continuous pattern being evaporated.

Another aspect of the invention, an active layer pattern is applied to a dielectric substrate having a first electrode, wherein the pattern is controlled by increasing the rate of evaporation.

The foregoing general description and the following detailed description are exemplary and explanatory only and are not restrictive of the invention, as defined in the appended claims.

BRIEF DESCRIPTION OF THE DRAWINGS

The invention is illustrated by way of example and not limitation in the accompanying figures.

DETAILED DESCRIPTION

Figure 1:
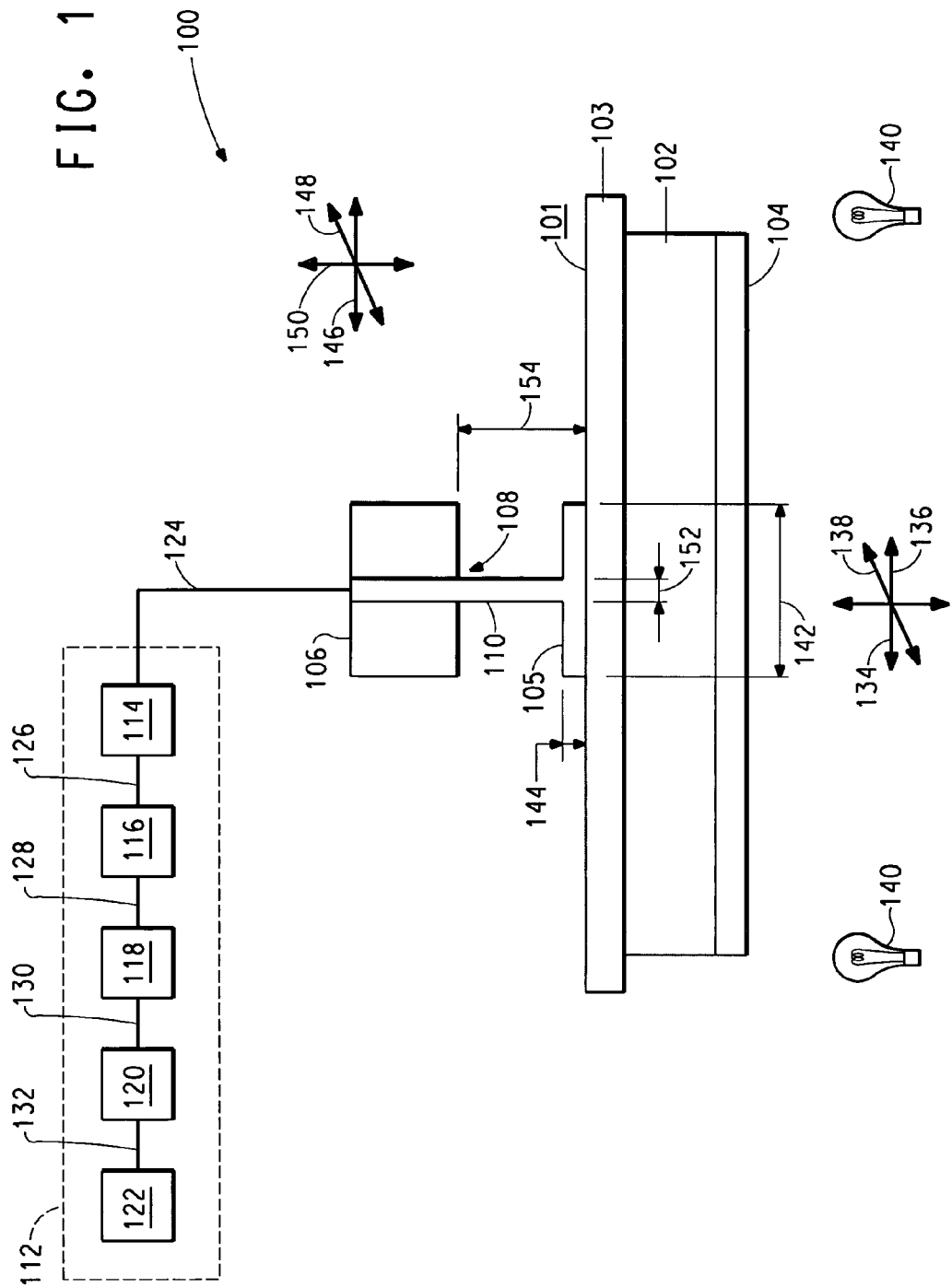
FIG. 1 is schematic diagram of a liquid media pattern generation system.

The present invention provides a process for patterning a substrate with a liquid media. The pattern is generated by forming a pattern with a liquid media on a substrate while the substrate is heated.

DEFINITIONS AND CLARIFICATION OF TERMS

Before addressing details of embodiments described below, some terms are defined or clarified.

As used herein, the term "active" when referring to a layer or material is intended to mean a layer or material that exhibits electronic properties, electro-radiative properties, or a combination thereof. An active layer material may emit radiation or exhibit a change in concentration of electron-hole pairs when responding to radiation.

The terms "array," "peripheral circuitry" and "remote circuitry" are intended to mean different areas or components of the organic electronic device. For example, an array may include a number of pixels, cells, or other structures within an orderly arrangement (usually designated by columns and rows). The pixels, cells, or other structures within the array may be controlled locally by peripheral circuitry, which may lie within the same organic electronic device as the array but outside the array itself. Remote circuitry typically lies away from the peripheral circuitry and can send signals to or receive signals from the array (typically via the peripheral circuitry). The remote circuitry may also perform functions unrelated to the array. The remote circuitry may or may not reside on the substrate having the array.

The term "continuous" when referring to a layer is intended to mean a layer that covers an entire substrate or portion of a substrate (e.g., the array) without any breaks in the layer. Note that a continuous layer may have a portion that is locally thinner than another portion and still be continuous if there is no break or gap in the layer.

The term "continuous pattern" is intended to mean a geometric design such as a line, an arc, or the like that is deposited with a flow of material that is unified and continuous.

The term "evaporating at least a portion of the continuous pattern" is intended to mean that the elevated temperature of the substrate volatilizes some of the liquid media upon contact with the substrate and continues to volatilize portions of the liquid media as a pattern develops such that the dimensions of the pattern are controlled.

The term "emission maximum" is intended to mean the highest intensity of radiation emitted. The emission maximum has a corresponding wavelength or spectrum of wavelengths (e.g. red light, green light, or blue light).

The term "filter," when referring to a layer material, is intended to mean a layer or material separate from a radiation-emitting or radiation-sensing layer, wherein the filter is used to limit the wavelength(s) of radiation passing through such layer or material. For example, a red filter layer may allow substantially only red light from the visible light spectrum to pass through the red filter layer. Therefore, the red filter layer filters out green light and blue light.

The term "filter" when referring to a liquid supply system, is intended to mean a material or mass that separates certain other matter in a suspension.

The term "organic electronic device" is intended to mean a device including one or more organic active layers or materials. Organic electronic devices include: (1) devices that convert electrical energy into radiation (e.g., a light-emitting diode, light emitting diode display, flat panel light, or diode laser), (2) devices that generate signals based at least in part in response to environmental conditions and may or may not include electronics used for detection or to perform other logic operations (e.g., photodetectors (e.g., photoconductive cells, photoresistors, photoswitches, phototransistors, phototubes), IR detectors, biosensors), (3) devices that convert radiation into electrical energy (e.g., a photovoltaic device or solar cell), and (4) devices that include one or more electronic components that include one or more organic active layers (e.g., a transistor or diode).

The term "orifice" is intend to mean an opening though which the liquid media passes.

The term "heating" is intended to mean the adding of energy to the substrate that causes a rise in temperature of the substrate.

The term "diameter" is intended to mean the distance across the orifice.

The term "primary surface" refers to a surface of a substrate from which electronic components are fabricated.

The phrase "room temperature" is intended to mean a temperature in a range of approximately 20-25° C.

The term "well structure" refers to a structure used to confine a liquid during processing. A well structure may also be called a dam, dividers, or a frame.

The term "blue light" is intended to mean radiation that has a wavelength in a range of approximately 400-500 nm.

The term "evaporating" is intended to mean converting a material from a liquid or solid phase to a vapor phase.

The term "green light" is intended to mean radiation that has a wavelength in a range of approximately 500-600 nm.

The term "liquid medium (media)" is intended to mean any fluid or combination of fluids and solids that is used in the precision stream deposition technique, wherein the liquid media forma a precisions stream which is applied to the substrate to make a pattern.

The term "viscosity" is intended to mean a material characteristic that measures the rate of change of shear forces. In the present context, a low viscosity material minimally resists the rate of change of shear forces, whereas a high viscosity material greatly resists the rate of change of shear forces. Thus, a low viscosity fluid has a tendency to spread when applied to a substrate, whereas a high viscosity fluid does not have a tendency to spread.

The term "pattern" is intended to mean any geometric design including lines, circles, arcs, and any derivations therefrom disposed on the substrate by a precision stream.

The term "precision stream" is intended to mean a controlled stream of liquid media that exits though an orifice. This controlled stream allow for deposition of a geometric pattern on a substrate where the geometric pattern is defined.

The term "precision stream deposition technique" is intended to mean a liquid deposition technique, wherein at least a part of an organic layer is formed from a liquid solution that is deposited in a continuous stream to form a desired pattern. Features of a pattern formed by a precision stream deposition technique can be characterized by, for instance, lines of liquid solution with widths on the scale of the height or width of an individual pixel of an array of pixels. An ink jet process, where discrete volumes of liquid are deposited in a discontinuous manner, is not a precision stream deposition technique.

The term "radiation-emitting component" is intended to mean an electronic component, which when properly biased, emits radiation at a targeted wavelength or spectrum of wavelengths. The radiation-emitting component is typically characterized as having an emission maximum at the targeted wavelength. The emitted radiation may be within the visible-light spectrum or outside the visible-light spectrum (ultraviolet ("UV") or infrared ("IR")). A light-emitting diode is an example of a radiation-emitting component.

The term "red light" is intended to mean radiation that has a wavelength in a range of approximately 600-700 nm.

The term "substrate" is intended to mean a base material and all layer(s), member(s), and structure(s) present over the base material at a particular point in a process. For example, before any processing occurs, the substrate and the base material may be the same. However, before forming an organic active layer, a substrate may include the base material, first electrodes, and a charge transport layer.

The term "visible light spectrum" is intended to mean a radiation spectrum having wavelengths corresponding to approximately 400-700 nm.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present). Also, use of the "a" or "an" are employed to describe elements and components of the invention. This is done merely for convenience and to give a general sense of the invention. This description should be read to include one or at least one and the singular also includes the plural unless it is obvious that it is meant otherwise.

Group numbers corresponding to columns within the periodic table of the elements use the "New Notation" convention as seen in the *CRC Handbook of Chemistry and Physics*, 81$^{st}$ Edition (2000).

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductor arts.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

DETAILED DESCRIPTION OF THE DRAWINGS

FIG. 1 is a simplified schematic diagram of a liquid media pattern generation system 100. Pattern generation system 100 has several main parts which include a stage 102, a heating device 104, a nozzle assembly 106 with an orifice 108, a precision stream 110, a liquid supply system 112 which further includes a filter 114, a pressure meter, 116, a flow meter 118, a pump 120, a liquid source 122. Lines 124-132 represent plumbing interconnections between the various parts of pattern generation system 100. While a substrate 103 having surface 101 is shown, it should be understood that substrate 103 is a work piece and is not an integral part of pattern generation system 100. All materials used in pattern generation system 100 need to be compatible with each other as well as the materials used in substrate 103. It should be understood that pattern generation system 100, as illustrate is vastly simplified so as to more clearly illustrate the invention. Additionally, it should be noted that the illustrations in FIGS. 1-5 are not drawn to scale. Thus no representation as to actual distance or dimension can be made from the drawings. Identical or similar elements will retain their original identifying numerals.

Liquid supply system 112 illustrates a variety of parts which may be placed remotely from nozzle assembly 106. However, it should be understood that the various parts can be placed where ever necessary depending upon the specific design of pattern generation system 100. It should also be understood that some parts liquid supply system 112 can be left out entirely depending upon the specific design of the pattern generation system 100.

Liquid source 122 illustrates a receptacle or source of any suitable liquid media. The liquid media can range from being organic chemically based to being aqueous based, or any mixture thereof. It should be noted that material selection for the liquid media that fills liquid source 122 needs to be compatible with other materials used in pattern generation system 100 and including substrate 103 and/or the materials integrated therein.

It should be understood that one or more liquid media compositions may be used making the liquid media. The liquid media contemplated for use in the practice of the invention are chosen so as to provide proper solution characteristics for the material system at hand and the desired results. Some factors to be considered when choosing a liquid media include, for example, viscosity of the resulting solution, emulsion, suspension, or dispersion, molecular weight of a polymeric material, solids loading, type of liquid medium (e.g., organically based, aqueous based, or a combination thereof), vapor pressure of the liquid medium, temperature of an underlying substrate, thickness of an organic layer that receives the liquid media, and the interactions between the various liquid media, or any combination thereof.

When selecting various liquid media systems, care needs to be exercise because one particular liquid medium may not be compatible with other liquid media and/or organic layers. Thus, the various elements of organic material need to be carefully considered.

In some embodiments, the liquid medium (media) includes at least one organic solvent. Exemplary organic solvents include halogenated solvents, hydrocarbon solvents, aromatic hydrocarbon solvents, ether solvents, cyclic ether solvents, alcohol solvents, ketone solvents, nitrile solvents, sulfoxide solvents, amide solvents, and combinations thereof.

Exemplary halogenated solvents include carbon tetrachloride, methylene chloride, chloroform, tetrachloroethylene, chlorobenzene, bis(2-chloroethyl)ether, chloromethyl ethyl ether, chloromethyl methyl ether, 2-chloroethyl ethyl ether, 2-chloroethyl propyl ether, 2-chloroethyl methyl ether, and combinations thereof.

Exemplary hydrocarbon solvents include pentane, hexane, cyclohexane, heptane, octane, decahydronaphthalene, petroleum ethers, ligroine, and combinations thereof.

Exemplary aromatic hydrocarbon solvents include benzene, naphthalene, toluene, xylene, ethyl benzene, cumene (iso-propyl benzene)mesitylene (trimethyl benzene), ethyl toluene, butyl benzene, cymene(iso-propyl toluene), diethylbenzene, iso-butyl benzene, tetramethyl benzene, sec-butyl benzene, tert-butyl benzene, and combinations thereof.

Exemplary ether solvents include diethyl ether, ethyl propyl ether, dipropyl ether, disopropyl ether, dibutyl ether, methyl t-butyl ether, glyme, diglyme, benzyl methyl ether, isochroman, 2-phenylethyl methyl ether, n-butyl ethyl ether, 1,2-diethoxyethane, sec-butyl ether, diisobutyl ether, ethyl n-propyl ether, ethyl isopropyl ether, n-hexyl methyl ether, n-butyl methyl ether, methyl n-propyl ether, and combinations thereof.

Exemplary cyclic ether solvents suitable include tetrahydrofuran, dioxane, tetrahydropyran, 4 methyl-1,3-dioxane, 4-phenyl-1,3-dioxane, 1,3-dioxolane, 2-methyl-1,3-dioxolane, 1,4-dioxane, 1,3-dioxane, 2,5-dimethoxytetrahydrofuran, 2,5-dimethoxy-2,5-dihydrofuran, and combinations thereof.

Exemplary alcohol solvents include methanol, ethanol, 1-propanol, 2-propanol, 1-butanol, 2-butanol, 2-methyl-1-propanol (i.e., iso-butanol), 2-methyl-2-propanol (i.e., tert-butanol), 1-pentanol, 2-pentanol, 3-pentanol, 2,2-dimethyl-1-propanol, 1-hexanol, cyclopentanol, 3-methyl-1-butanol, 3-methyl-2-butanol, 2-methyl-1-butanol, 2,2-dimethyl-1-propanol, 3-hexanol, 2-hexanol, 4-methyl-2-pentanol, 2-methyl-1-pentanol, 2-ethylbutanol, 2,4-dimethyl-3-pentanol, 3-heptanol, 4-heptanol, 2-heptanol, 1-heptanol, 2-ethyl-1-hexanol, 2,6-dimethyl-4-heptanol, 2-methylcyclohexanol, 3-methylcyclohexanol, 4-methylcyclohexanol, and combinations thereof.

Alcohol ether solvents may also be employed. Exemplary alcohol ether solvents include 1-methoxy-2-propanol, 2-methoxyethanol, 2-ethoxyethanol, 1-methoxy-2-butanol, ethylene glycol monoisopropyl ether, 1-ethoxy-2-propanol, 3-methoxy-1-butanol, ethylene glycol monoisobutyl ether, ethylene glycol mono-n-butyl ether, 3-methoxy-3-methylbutanol, ethylene glycol mono-tert-butyl ether, and combinations thereof.

Exemplary ketone solvents include acetone, methylethyl ketone, methyl iso-butyl ketone, cyclohexanone, isopropyl methyl ketone, 2-pentanone, 3-pentanone, 3-hexanone, diisopropyl ketone, 2-hexanone, cyclopentanone, 4-heptanone, iso-amyl methyl ketone, 3-heptanone, 2-heptanone, 4-methoxy-4-methyl-2-pentanone, 5-methyl-3-heptanone, 2-methylcyclohexanone, diisobutyl ketone, 5-methyl-2-octanone, 3-methylcyclohexanone, 2-cyclohexen-1-one, 4-methylcyclohexanone, cycloheptanone, 4-tert-butylcyclohexanone, isophorone, benzyl acetone, and combinations thereof.

Exemplary nitrile solvents include acetonitrile, acrylonitrile, trichloroacetonitrile, propionitrile, pivalonitrile, isobutyronitrile, n-butyronitrile, methoxyacetonitrile, 2-methylbutyronitrile, isovaleronitrile, N-valeronitrile, n-capronitrile, 3-methoxypropionitrile, 3-ethoxypropionitrile, 3,3'-oxydipropionitrile, n-heptanenitrile, glycolonitrile, benzonitrile, ethylene cyanohydrin, succinonitrile, acetone cyanohydrin, 3-n-butoxypropionitrile, and combinations thereof.

Exemplary sulfoxide solvents suitable include dimethyl sulfoxide, di-n-butyl sulfoxide, tetramethylene sulfoxide, methyl phenyl sulfoxide, and combinations thereof.

Exemplary amide solvents suitable include dimethyl formamide, dimethyl acetamide, acylamide, 2-acetamidoethanol, N,N-dimethyl-m-toluamide, trifluoroacetamide, N,N-dimethylacetamide, N,N-diethyldodecanamide, epsilon-caprolactam, N,N-diethylacetamide, N-tert-butylformamide, formamide, pivalamide, N-butyramide, N,N-dimethylacetoacetamide, N-methyl formamide, N,N-diethylformamide, N-formylethylamine, acetamide, N,N-diisopropylformamide, 1-formylpiperidine, N-methylformanilide, and combinations thereof.

Crown ethers contemplated include all crown ethers which can function to assist in the reduction of the chloride content of an epoxy compound starting material as part of the combination being treated according to the invention. Exemplary crown ethers include benzo-15-crown-5; benzo-18-crown-6; 12-crown-4; 15-crown-5; 18-crown-6; cyclohexano-15-crown-5; 4',4"(5")-ditert-butyldibenzo-18-crown-6; 4',4"(5")-ditert-butyldicyclohexano-18-crown-6; dicyclohexano-18-crown-6; dicyclohexano-24-crown-8; 4'-aminobenzo-15-crown-5; 4'-aminobenzo-18-crown-6; 2-(aminomethyl)-15-crown-5; 2-(aminomethyl)-18-crown-6; 4'-amino-5'-nitrobenzo-15-crown-5; 1-aza-12-crown-4; 1-aza-15-crown-5; 1-aza-18-crown-6; benzo-12-crown-4; benzo-15-crown-5; benzo-18-crown-6; bis((benzo-15-crown-5)-15-ylmethyl) pimelate; 4-bromobenzo-18-crown-6; (+)-(18-crown-6)-2,3,11,12-tetra-carboxylic acid; dibenzo-18-crown-6; dibenzo-24-crown-8; dibenzo-30-crown-10; ar-ar'-di-tert-butyldibenzo-18-crown-6; 4'-formylbenzo-15-crown-5; 2-(hydroxymethyl)-12-crown-4; 2-(hydroxymethyl)-15-crown-5; 2-(hydroxymethyl)-18-crown-6; 4'-nitrobenzo-15-crown-5; poly-[(dibenzo-18-crown-6)-co-formaldehyde]; 1,1-dimethylsila-11-crown-4; 1,1-dimethylsila-14-crown-5; 1,1-dimethylsila-17-crown-5; cyclam; 1,4,10,13-tetrathia-7,16-diazacyclooctadecane; porphines; and combinations thereof.

In another embodiment, the liquid medium includes water. A conductive polymer complexed with a water-insoluble colloid-forming polymeric acid can be deposited over a substrate and used as a charge transport layer.

Liquid media can include many different classes of materials (e.g., halogenated solvents, hydrocarbon solvents, aromatic hydrocarbon solvents, water, etc.) which are in part described above. Mixtures of more than one of the liquid media from different classes may also be used.

By mixing the appropriate solvent and other components, a suitable composition of the liquid media having the proper solution characteristics is made.

Line 132 represents a plumbing line that connects liquid source 122 to pump 120. The liquid media flows from liquid source 122 though line 132 to pump 120, thereby supplying the liquid media to pump 120.

Pump 120 can be any suitable pump or device that will produce an even flow from pump 120 down stream to the other parts of pattern generation system 100. For example, pump 120 could be a constant pressure pump or like. In another example, the liquid media could be backed or pressurized by a non reactive gas, such as nitrogen, so that pressure is put on the liquid media and flow is developed. In both cases, an even and consistent pressure is desired so that precision stream 110 is developed.

Line 130 represents a plumbing line that connects pump 120 to flow meter 118. Flow meter 118 can be any suitable device that will measure the flow of liquid media through subsequent parts of liquid supply system 112 and though orifice 108 onto substrate 103. In some cases, flow meter 118 can also regulate the flow of the liquid media though orifice 108. Typically and by way of example only, in this kind of metering device, an electronic signal is generated that correlates to an actual flow rate of the liquid media. The electronic signal is fed back to an electronic device that compares what the actual flow rate is to the desired flow rate. If the desired flow rate and the actual flow rate are not the same, a metering device is either opened or closed so as to allow more or less flow until the desired flow rate and actual flow rates are the same.

Line 128 represents a plumbing line that connects flow meter 118 to pressure gauge 116. Pressure gauge 116 can be any suitable gauge for that specific application. Typically and by way of example only, when the liquid media is an organic solution, pressure can range from 0.1 to 10.00 pounds per square inch (PSI).

Line 126 represents a plumbing line that connects pressure gauge 116 and filter 114. Any suitable filter 114 can be used as long as it is process compatible. Typically, filter 114 is used for filtering out contamination from the liquid media so that upon deposition of the liquid media on the substrate 103 is contamination and defect free. Thus, any suitable filter having a desired pore size and compatibility can be used. It should also be noted that filter 114 can be a first stage filter with a second stage filter (not show) being located closer to orifice 108 of nozzle assembly 106.

Line 124 represents a plumbing line that couples filter 114 to nozzle assembly 106. Nozzle assembly 106 illustrates a simplified schematic system for generating precision stream 110 though orifice 108. It should be understood that nozzle assembly 106 can be much more complicated than is shown and that many complicating details have been omitted for the sake of clarity. Generally, nozzle assembly 106 can be made capable of movement along the x, y, and z axis's, illustrated by arrow's 146, 148, and 150 by any suitable method such as electromechanically, hydraulically, pneumatically, or the like. However, it should be noted that movement of nozzle assembly 106 is application specific and can vary from system to system. For example, some system designs may require only a movement in the X axis while other designs may require movement in the Y axis, while still others may require movement in both X, Y axis's, and still others might require movement along the X, Y, and Z axis's.

Generally, nozzle assembly 106 is capable of moving so that a variety of factors can be optimized for making pattern 105. Additionally, while only a single nozzle assembly 106 is shown, it should be understood that additional nozzles assemblies can also be used so as to facilitate pattern generation, illustrated by pattern 105 and use of other liquid media. For example, a row of nozzles can be assembled such that the nozzles can be independently moved or tied together depending upon the specific application. Liquid media flows though line 124, nozzle assembly 106, and orifice 108 to form precision stream 110. Precision stream 110 then deposits the liquid media on substrate 103 to form a pattern 105.

Precision stream 110 is generated by controlling several factors including pressure, viscosity of the liquid media, a diameter 152 of orifice 108, and a shape of orifice 108. Typically, the viscosity can range from 0.8 to 40.0 Centipoise (cP); however, in some liquid media systems, the viscosity can range from 10.0 to 30.0 cP. In addition to these factors, other factors that interact with precision stream 110 that affects pattern 105 include distance 154 between orifice 108 and substrate 103, a relative speed of precision stream 110 to substrate 103, and the like.

Pressure is applied to the liquid media to force the liquid media though orifice 108 to form precision stream 110. Pressure can be applied to the liquid media by any suitable method, such as backing with a non reacting gas, use of constant pressure fluid pumps, or the like. By keeping the liquid media under a constant pressure, pattern 105 is more consistent, repeatable, and subsequently more robust. While any suitable pressure can be selected for any given material system in most cases the liquid media is held at a pressure between 0.1 and 10.0 pounds per square inch. However, depending upon the liquid media and other factors, the liquid media can also be held under pressure with a range between 1.0 to 7.0 pounds per square inch.

While orifice 108 is shown having a circular shape with a diameter 206, it should be understood that depending upon the application orifice 108 can be made with any suitable shape such as oval, elliptical, or the like. By way of example only, with orifice 108 having a circular shape, diameter 152 can range between 50 to 200 microns. In another, example, diameter 152 can range between 75 to 150 microns. In yet another example, diameter 152 can range between 100 to 125 microns.

Generally, distance 154 between orifice 108 and surface 101 of substrate 103 can be any suitable distance. However, it should be understood that distance 154 is application specific and can change depending upon the specific application and the interplay between the other factors. Typically, however, distance 154 can range from 150 millimeters to 500 millimeters. By adjusting distance 154, characteristics of pattern 105 can be altered. For example, as distance 154 increases, width 142 of pattern 105 tends to decrease. Conversely, as distance 154 decreases, width 142 of pattern 105 tends to increase. Generating a relative movement between precision stream 110 and substrate 103 can be accomplished by any suitable method such as having substrate 103, nozzle 106, or any combination thereof move. By generating a velocity of relative movement between precision stream 110 and substrate 103, pattern 105 can be adjusted. By way of example, with pattern 105 being a line, increasing the velocity at which the relative movement occurs, width 142 of the line tends to decreases. Conversely, decreasing the velocity at which the relative movement occurs, width 142 of the line tends to increases.

Primary surface 107 of substrate 103 receives the liquid media from precession stream 110 though orifice 108. Substrate 103 can be made of any suitable material. These materials can be broadly grouped as dielectric, conductive, or semiconductive materials. Examples of dielectric materials, but not limited to, are glass materials, plastic materials, and the like. Examples of conductive materials, but not limited to, are metal materials and alloys, such as gold, copper, silver, and the like. Examples of semiconductive material, but not limited to, are silicon, galiumium arsenide, sapphire, and the like. It should also be understood that substrate 103 can have been previously processed, thereby forming other patterns, electrical and mechanical devices, a number of different materials incorporated therein, and the like.

Stage 102 is illustrated holding substrate 102. Stage 102 can be made by any suitable method or technique. Typically, stage 102 takes the form of an X-Y stage, a platen, or a chuck. Movement of X-Y stage is illustrated by arrows 134 and 136. However, it should be understood that in some embodiments, stage 102 can also move in the Z axis, illustrated by arrow 138. It should be understood that stage 102 can be electromechanically engaged so that it can move independently of nozzle assembly 106. By enabling both stage 102 and nozzle assembly 106 to move independently, a more robust process can be achieved to produce a pattern 105. However, it should be noted that this independent movement is not necessary for the practice of the invention. Substrate 103 is secured to stage 102 by any suitable method such as drawing a vacuum on a backside of substrate 103, mechanically clamping substrate 103, or the like.

Heating device 104 is made by any suitable manner and can be directly integrated into stage 102 or not. It should be understood that selection of heating methods such as conduction, convection, and radiant is application specific and that any single method or combination of methods can be used to elevate temperature of stage 102 which in turn elevates the temperature of substrate 103 to a desired level. For example, heaters such as resistive elements can be attached to or embedded into stage 102 to elevate the temperature of stage 102 and subsequently substrate 103. In another example, radiant light energy, illustrated by radiant heat sources 140 can be used to generate and elevated temperature in stage 102 and subsequently substrate 103. While any suitable temperature and ranges can be used, typically the temperature ranges between 25 to 80 degrees Centigrade are used to heat substrate 103. Depending upon other factors such as volitilty of the liquid media, another suitable temperature range is from 35 to 70 degrees Centigrade.

As shown in FIG. 1, with substrate 103 being heated and with precision stream 110 depositing pattern 105, critical dimensions such as width 142 and thickness 144 are controlled. Generally, depending upon the composition of the liquid media (viscosity, percent solids, solvents used, and the like) and heating of substrate 103 with subsequent heating of pattern 105, a portion of pattern 105 evaporates because of the elevated temperature that drive off the most volatile portions of the liquid media, thereby at least in part solidifying pattern 105 and controlling the spread of pattern 105. Further, it should be understood that this process of controlling pattern 105 widths and thicknesses (e.g. lines) can be used without the benefit of banks 402, fluorinated or not, or other structures on substrate 103. Thus, by the process of increasing evaporation of portions of the liquid media making pattern 105, it is now possible to use liquid media with very low viscosities to generate patterns on substrate 103 while controlling critical dimensions such as width 142 and thickness 144.

Figure 2:
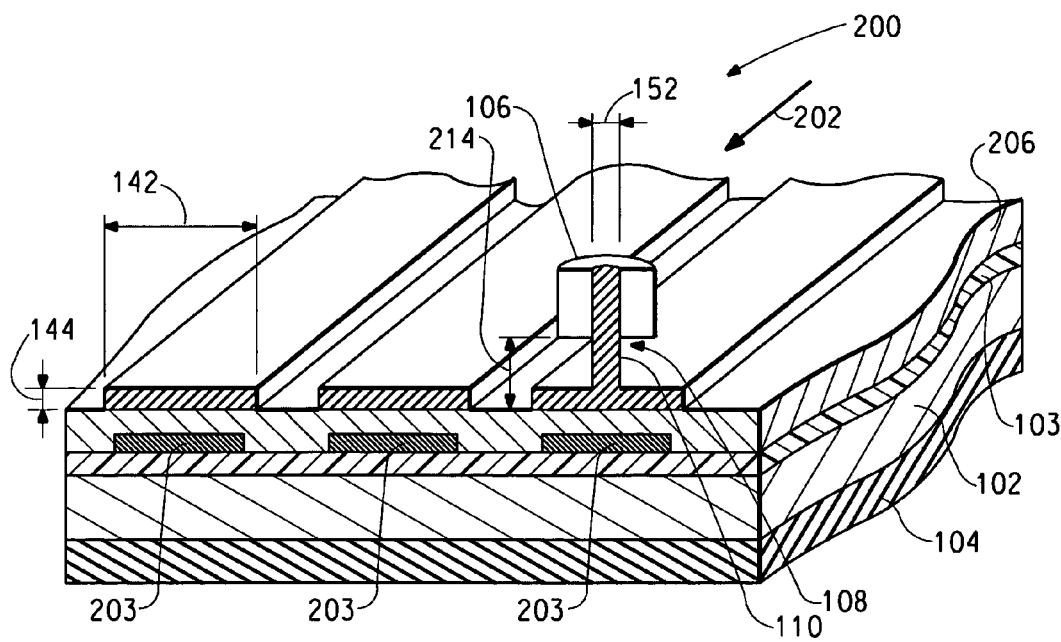
FIGS. 2 and 3 are greatly enlarged sectional perspective views of a planar organic device in partial fabrication.
Figure 3:
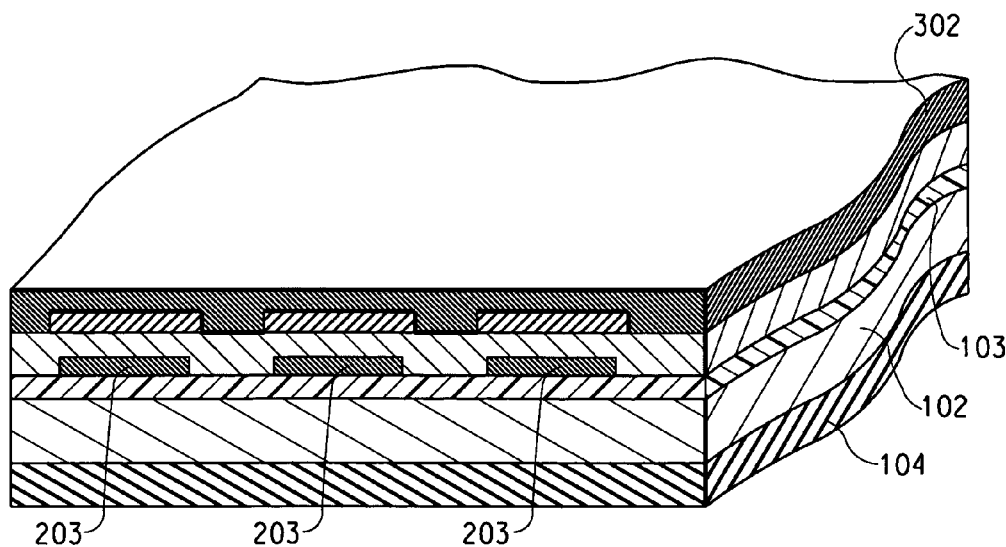
Figure 4:
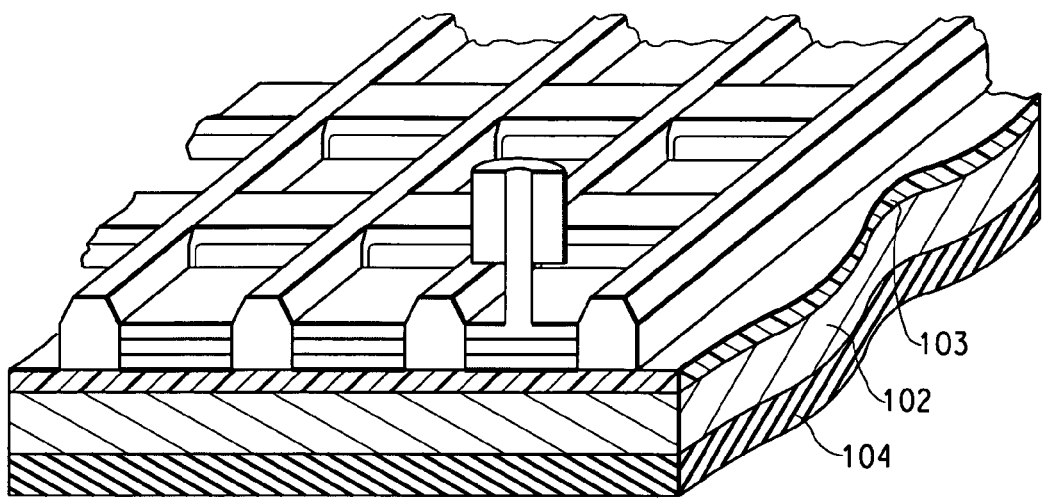
FIGS. 4 and 5 are greatly enlarged sectional perspective views of a organic device employing bank structures in partial fabrication.
Figure 5:
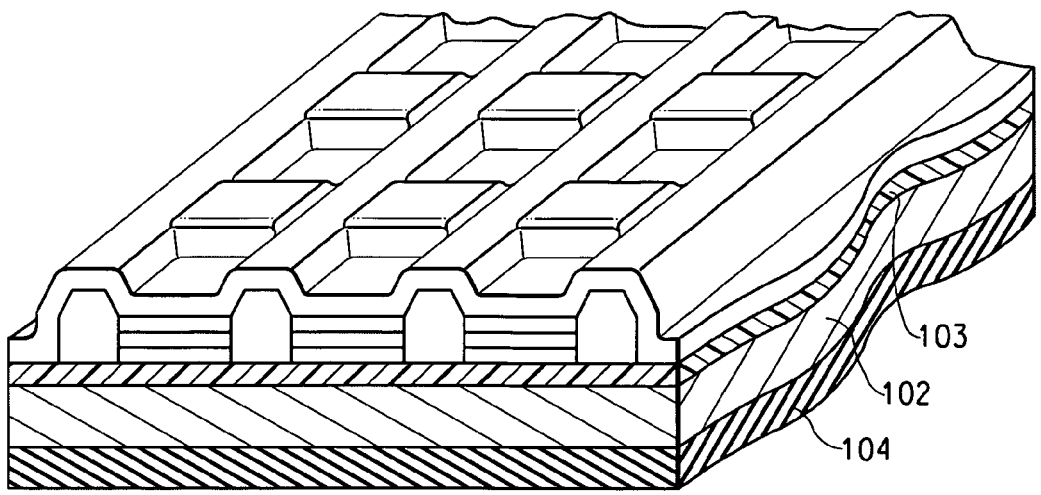

FIGS. 2 and 3 are greatly enlarged simplified sectional perspective views of a portion of a planar electrolumincent device 200 and FIGS. 4 and 5 are a greatly enlarged simplified sectional perspective views of a portion of a banked electroluminescent device 400 in partial fabrication. As illustrated in FIG. 2, heating device 104 is attached or integrated into stage 102 with substrate 103 being coupled to stage 102. Substrate 103 has been previously processed so that first electrodes 203 are disposed on substrate 103 with an organic layer 206 being deposited over first electrodes 203. Also, it should be noted that patterns 208 and 210 have previously been deposited. Pattern 212 is in the process of being deposited over organic layer 206 and first electrodes 203. Arrow 202 illustrates the direction of travel of nozzle assembly 106 with the liquid media being forced out of orifice 108 into precision stream 110.

As illustrated in FIGS. 4 and 5, substrate 103 has incorporated banks 402 and wells structures 404 into the underlying structure on substrate 103. Banks 402 are made on substrate 103 to separate individual subpixels of electroluminescent device 402. Banks 804 are made by any suitable method, technique, or combination of techniques including, but not limited to, photolithography, etching, deposition, and the like. Banks 804 can be made of any suitable dielectric material such as an organic material, an inorganic material, or the like. By way of example, banks 402 are made with a depositing a photoresist material on substrate 103. The photoresist is then pattern and developed such that portions of photoresist remain on the substrate 106 while other portions of substrate 103 are exposed. The remaining photoresist on substrate 106 become banks 402. Alternatively and by way of example, an oxide layer could be deposited or grown, photo lithographically patterned, and etched, thereby forming a bank 802 or well structure of oxide.

Referring now to FIGS. 2-5, while only a small number of pixels and subpixel are shown, it should be understood that many of these devices are populated over substrate 103 forming arrays in order to make a display. It should also be understood that FIGS. 2-5 can extend into an out of the drawings. Pixel drivers and other circuits (not shown) may be formed within or over substrate 103 using any suitable conventional technique. The other circuits (not shown) outside the array may include peripheral and remote circuitry used to control the pixels within the array. The focus of fabrication is on the pixel array rather than the peripheral or remote circuitry. Substrate 103 can be of any thickness in a range of approximately 12-2500 microns.

First electrodes 203 are formed over portions of substrate 103. First electrodes 203 act as anodes and may include one or more conductive layers. The surface of first electrodes 203 furthest from substrate 103 includes a high work function material. In this illustrative example, first electrodes 203 include one or more of layers of indium tin oxide, aluminum tin oxide, or other materials conventionally used for anodes within organic electronic devices. In this embodiment, first electrodes 203 transmit at least 70% of the radiation to be emitted from or responded to by subsequently formed organic active layers 208, 210, and 212. In one embodiment, the thickness of first electrodes 203 is in a range of approximately 100-200 nm. However, if radiation does not need to be transmitted through the first electrodes 402, the thickness may be greater, such as up to 1000 nm or even thicker.

First electrodes 203 can be formed using any suitable method, technique, or combination thereof including conventional coating, casting, vapor deposition (chemical or physical), printing (ink jet printing, screen printing, solution dispense, or any combination thereof), other deposition techniques, or any combination thereof. In one embodiment, the first electrodes 203 may be formed as a patterned layer (e.g., using a stencil mask) or by depositing the layer(s) over all the substrate 103 and using a conventional patterning technique which exposes certain portions while protecting other portions of the layer(s). The exposed portions of the layer(s) are then removed by any suitable method and cleaned, thereby resulting in the patterned layer(s).

Organic layer 206 can be formed over the first electrodes 203 as shown in FIGS. 2-5. Organic layer 206 may include one or more layers and is substantially continuous over substrate 103. However, it should be understood that, in some specific designs organic layer 206 may be designed to be deposited over at least a portion of first electrodes 203. For example, organic layer 206 may include a charge transport layer or other layers and materials that can aid in the movement of charge into an active area. However, it should also be understood that in some applications the charge transport layer does not need to be incorporated into the device. Also, it should be noted that when the charge transport layers lay between first electrodes 203 and organic active layers 208-212, the charge transport layers will be a hole-transport layer, and when the charge transport layer lies between the organic active layers 208-212 and subsequently formed second electrode 302, as shown in FIGS. 3 and 5, that act as cathodes, the charge transport layers will be an electron-transport layer. The configuration as shown in FIGS. 3 and 5 has organic layer 206 acting as the charge transport layer that acts as the hole-transport layer.

Organic layer 206 can be formed by one or more of any number of different techniques including spin coating, casting, vapor depositing (chemical or vapor), printing (ink jet printing, screen printing, solution dispensing, continuous stream, or any combination thereof), other depositing or any combination thereof for appropriate materials as described below. Additionally, one or both of the organic layer(s) 206 and the organic active layer(s) 208-212 may be cured after deposition.

In addition to facilitating transport of charge from the first electrodes 203 to organic active layers 208-212, the charge transport layer may also function as a charge injection layer facilitating injection of charged carriers into the organic active layers 208-212, a planarization layer over first electrodes 203, a passivation or chemical barrier layer between first electrodes 203 and organic active layers 208-212, or any combination thereof.

When organic layer 206 acts as the charge transport, any number of materials may be used (and its selection will depend on the device and the organic active layers 208-212 material) and in this illustrative example, it may include one or more of polyaniline ("PANI"), poly(3,4-ethylenedioxythiophene) ("PEDOT") or material(s), and tetrcyanoquinodimethane(TTF-TCQN), and the like conventionally used as hole-transport layers as used in organic electronic devices. The hole-transport layer typically has a thickness in a range of approximately 100-250 nm as measured over the substrate 103 at a location spaced apart from the first electrodes 203.

As shown in FIGS. 2 and 3, organic layer 206 is substantially continuous over first electrodes 203. In one embodiment, the organic layer 206 may be substantially continuous over the entire substrate, including the peripheral and remote circuitry areas. Note that organic layer 206 has regions where organic layer 206 is locally thinner, but it is not discontinuous over the area of substrate 103 in which organic layer 206 is intended to be formed (e.g., the array). Organic layer 206, including the charge transport layers, is locally thinner over first electrodes 203 and locally thicker away from first electrodes 203. As shown in FIGS. 4 and 5, organic layer 206 is also substantially continuous over first electrodes 203; however, banks 302 can interrupt the continuousness of organic layer 206. Organic layer 206 typically has a thickness in a range of approximately 50-500 nm as measured over the substrate 103 at a location spaced apart from the first electrodes 203.

Organic active layers 208-212 are deposited on certain portions of organic layer 206 which overlay portions of first electrodes 203. Deposition of active organic layers 208-212 is achieved by forming precision stream 110 from orifice 108 of nozzle 106 and developing a relative motion between precision stream 110 and substrate 103.

With substrate 103 being heated, precision stream 110 contacts substrate 103. As precision stream 110 contacts substrate 103, the liquid media spreads across substrate 103 and portions of the liquid media begin to evaporate that form pattern 212. As portions of liquid media on substrate 103 evaporate, side walls 213 begin to form and the viscosity of the liquid media increases due to the evaporation of the solvents in the liquid media. For example, with the liquid media being selected so as to produce a red light upon excitation, the liquid media is deposited over first electrode 203 by developing precision stream 110 from orifice 108 and having a relative motion between precision stream 110 and substrate 103. Thus, a line is formed on substrate 103 having a certain thickness and a certain width. This deposition procedure if in the proper position can be used for depositing a green light media and a blue light liquid media which can be exemplified by active organic layers 208 and 210, respectively.

The composition of organic active layers 208-212 typically depends upon the application of the organic electronic device. In the embodiment shown in FIGS. 2-5, the organic active layers 208-212 are used in radiation-emitting components.

Organic active layers 208-212 can include material(s) as conventionally used as organic active layers in organic electronic devices and can include one or more small molecule materials, one or more polymer materials, or any combination thereof. After reading this specification, skilled artisans will be capable of selecting appropriate material(s), layer(s) or both for organic active layers 208-212.

For a radiation-emitting organic active layer, suitable radiation-emitting materials include one or more small molecule materials, one or more polymeric materials; or a combination thereof. Small molecule materials may include those described in, for example, U.S. Pat. No. 4,356,429 ("Tang"); U.S. Pat. No. 4,539,507 ("Van Slyke"); U.S. Patent Application Publication No. US 2002/0121638 ("Grushin"); and U.S. Pat. No. 6,459,199 ("Kido"). Alternatively, polymeric materials may include those described in U.S. Pat. No. 5,247,190 ("Friend"); U.S. Pat. No. 5,408,109 ("Heeger"); and U.S. Pat. No. 5,317,169 ("Nakano"). Exemplary materials are semiconducting conjugated polymers. Examples of such polymers include poly(paraphenylenevinylene) (PPV), PPV copolymers, polyfluorenes, polyphenylenes, polyacetylenes, polyalkylthiophenes, poly(n-vinylcarbazole) (PVK), and the like. In one specific embodiment, a radiation-emitting active layer without any guest materials may emit blue light.

For a radiation-responsive organic active layer, suitable radiation-responsive materials may include many conjugated polymers and electroluminescent materials. Such materials include for example, many conjugated polymers and electro- and photo-luminescent materials. Specific examples include poly(2-methoxy,5-(2-ethyl-hexyloxy)-1,4-phenylene vinylene) ("MEH-PPV") and MEH-PPV composites with CN-PPV.

Materials can include any one or more of all known materials used for an electroluminescent layer, charge transport (e.g., hole transport, electron transport) layer, or other materials used for organic active layer and their corresponding dopants. Such materials can include organic dyes, organometallic materials, polymers (conjugated, partially conjugated, or non-conjugated), and combinations thereof. The guest materials may or may not have fluorescent or phosphorescent properties.

Examples of the organic dyes include 4-d icyanmethylene-2-methyl-6-(p-dimethyaminostyryl)-4H-pyran (DCM), coumarin, pyrene, perylene, rubrene, derivatives thereof, and combinations thereof.

Examples of organometallic materials include functionalized polymers comprising functional groups coordinated to at least one metal. Exemplary functional groups contemplated for use include carboxylic acids, carboxylic acid salts, sulfonic acid groups, sulfonic acid salts, groups having an OH moiety, amines, imines, diimines, N-oxides, phosphines, phosphine oxides, β-dicarbonyl groups, and combinations thereof. Exemplary metals contemplated for use include lanthanide metals (e.g., Eu, Tb), Group 7 metals (e.g., Re), Group 8 metals (e.g., Ru, Os), Group 9 metals (e.g., Rh, Ir), Group 10 metals (e.g., Pd, Pt), Group 11 metals (e.g., Au), Group 12 metals (e.g., Zn), Group 13 metals (e.g., Al), and combinations thereof. Such organometallic materials include metal chelated oxinoid compounds, such as tris(8-hydroxyquinolato)aluminum ($Alq_3$); cyclometalated iridium and platinum electroluminescent compounds, such as complexes of iridium with phenylpyridine, phenylquinoline, or phenylpyrimidine ligands as disclosed in Published PCT Application WO 02/02714, and organometallic complexes described in, for example, published applications US 2001/0019782, EP 1191612, WO 02/15645, WO 02/31896, and EP 1191614; and mixtures thereof.

Examples of conjugated polymers include poly(phenylenevinylenes), polyfluorenes, poly(spirobifluorenes), copolymers thereof, and mixtures thereof.

When used for the production of full color organic electronic devices, in one embodiment, a first material is selected to emit red light (with an emission maximum in a range of 600-700 nm) and a second material is selected to emit green light (with an emission maximum in a range of 500-600 nm). After placement of each of the liquid compositions, each pixel column contains three subpixels wherein one subpixel emits red light, one subpixel emits green light, and one subpixel emits blue light (with an emission maximum in a range of 400-500 nm). Alternatively, one or more materials can be contained in a single liquid composition and deposited to form a pixel or subpixel with a broader emission spectrum, for example with a Full Width Half Maximum (FWHM) of greater than 100 nm, or even selected to emit white light with an emission profile encompassing the visible spectrum of 400 to 700 nm.

Although not shown, an optional charge transport layer that acts as an electron-transport layer may be formed over organic active layers 208-212. The optional charge transport layer may include at least one of aluminum tris(8-hydroxyquinoline) or other material conventionally used as electron-transport layers in organic electronic devices. The optional charge transport layer can be formed by one or more of any number of different techniques including spin coating, casting, vapor deposition (chemical or physical), printing (ink jet printing, screen printing, solution dispense, or any combination thereof), other depositing technique, or any combination for appropriate materials as described below. The electron-transport layer typically has a thickness in a range of approximately 30-500 nm as measured over the substrate 103 at a location spaced apart from the first electrodes 203.

As shown in FIGS. 3 and 5, a second electrode 302 is formed over organic layer 206 and organic active layers 208-212. In this specific embodiment, second electrode 302 acts as a common cathode for an array. A surface of the second electrode 302 includes a low work function material. Second electrode 302 includes one or more of a Group 1 metal, Group 2 metal, or other materials conventionally used for cathodes within organic electronic devices.

Second electrode 302 can be formed using any suitable method, technique, or combination of techniques including a conventional coating, casting, vapor deposition (chemical or physical), printing (ink jet printing, screen printing, solution dispense, or any combination thereof), or other deposition technique, or any combination thereof. Second electrode 302 can be formed as a patterned layer (e.g., using a shadow mask) or by depositing one or more of several layers over the entire array and using a conventional patterning sequence. Typically, second electrode 302 is made of any suitable low work function metal, or combination of metals including Barium (Ba), Calcium (Ca), Lithium Floride (LiFl) with an Aluminium (Al) cap. Second electrode 302 has a thickness in a range of approximately 100-2000 nm. It should also be understood that second electrode 302 can also be made in the form of having a plurality of electrodes.

Typically, when second electrode 302 is formed on electroluminescent devices 200 and 400, a lid (not shown) with a desiccant (not shown) is attached to the substrate 106 at locations (not shown) outside the array to form a substantially completed device. A gap (not shown) lies between the second electrode 702 and the desiccant (not shown). The materials used for the lid (not shown) and desiccant (not shown) and the attaching process are conventional.

Generally, with active organic layers 208 being properly configure for emitting red, with active organic layer 210 being properly configured for green, and with active organic layer 212 being properly configured for emitting blue, applying an appropriate potential between first electrode 203 and second electrode 302 cause one or more of the sub pixels to radiate. By selecting the sub pixels to radiate across the array, a display is formed.

Moreover, use appropriate potentials are placed on the first electrodes 203 and second electrode 302. As one or more of the radiation-emitting components become sufficiently forward biased, such forward biasing can cause radiation to be emitted from organic active layers 208-212. For example, the potentials and current used for the radiation-emitting components may be adjusted to change the intensity of color emitted from such components to achieve nearly any color within the visible light spectrum.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense and all such modifications are intended to be included within the scope of invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. A method for depositing a pattern on a substrate comprising the steps of:
   providing a substrate;
   providing an electrode on the substrate;
   forming a continuous pattern with deposition of a precision continuous liquid phase stream on at least part of the electrode with a liquid media having a viscosity ranging from 0.8 cP to 40.0 cP; and
   evaporating a portion of the liquid media making up the pattern being deposited upon contact with the substrate.

2. The method for depositing a pattern on a substrate as claimed in claim 1, wherein the step of evaporating a portion of the liquid media is achieved by heating the substrate.

3. The method for depositing a pattern on a substrate as claimed in claim 2, wherein the heating of the substrate is achieved by convection heating.

4. The method for depositing a pattern on a substrate as claimed in claim 2, wherein heating the substrate ranges from 25 to 80 degrees Centigrade.

5. The method for depositing a pattern on a substrate as claimed in claim 4, wherein heating the substrate ranges from 35 to 70 degrees Centigrade.

6. The method for depositing a pattern on a substrate as claimed in claim 1, wherein the viscosity of the liquid media ranges from 10.0 cP to 30.0 cP.

7. A method for forming a pattern on an organic electronic device comprising the steps of:
   providing a substrate with a first electrode;
   applying an active organic layer with deposition of a precision continuous liquid phase stream over at least a portion of the first electrode to form a continuous pattern, the continuous pattern comprising a liquid media, the liquid media has a viscosity ranging from 0.8 to 40.0 cP; and evaporating at least a portion of the continuous pattern of the active layer upon contact with the substrate.

8. The method for forming a pattern on an organic electronic device as claimed in claim 7, wherein the step of evaporating at least a portion of the continuous pattern of the active layer, the evaporating is achieved by increasing a rate of evaporation of the at least a portion of the active by heating the substrate.

9. The method for forming a pattern on an organic electronic device as claimed in claim 8, wherein the heating of the substrate is achieved by a convection heating technique.

10. The method for forming a pattern on an organic electronic device as claimed in claim 7, wherein the viscosity ranges from 10.0 to 30.0 cP.

11. The method for forming a pattern on an organic electronic device as claimed in claim 7, further including the step of:

depositing an organic layer over the first electrode.

12. The method for forming a pattern on an organic electronic device as claimed in claim 7, further including depositing a second electrode over the active organic layer.

13. A method for depositing a pattern on a substrate comprising the steps of:

providing a substrate;

forming a pattern with deposition of a continuous liquid phase stream of a liquid media on the substrate, the liquid media having a viscosity ranging from 0.8 cP to 40.0 cP; and evaporating a portion of the liquid media making up the pattern being deposited upon contact with the substrate.

14. The method for depositing a pattern on a substrate as claimed in claim 13, wherein the step of evaporating a portion of the liquid media is achieved by heating the substrate.

15. The method for depositing a pattern on a substrate as claimed in claim 14, wherein the heating of the substrate is achieved by convection heating.

16. The method for depositing a pattern on a substrate as claimed in claim 14, wherein heating of the substrate ranges from 25 to 80 degrees Centigrade.

17. The method for depositing a pattern on a substrate as claimed in claim 16, wherein heating the substrate ranges from 35 to 70 degrees Centigrade.

18. The method for depositing a pattern on a substrate as claimed in claim 13, wherein the viscosity of the liquid media ranges from 0.10 to 30 cP.

* * * * *